(12) United States Patent
Shibata

(10) Patent No.: US 11,756,991 B2
(45) Date of Patent: Sep. 12, 2023

(54) SEMICONDUCTOR DEVICE AND MANUFACTURING METHOD FOR SEMICONDUCTOR DEVICE

(71) Applicant: LAPIS Semiconductor Co., Ltd., Yokohama (JP)

(72) Inventor: Hiroshi Shibata, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 163 days.

(21) Appl. No.: 17/205,408

(22) Filed: Mar. 18, 2021

(65) Prior Publication Data
US 2021/0305360 A1    Sep. 30, 2021

(30) Foreign Application Priority Data

Mar. 27, 2020    (JP) .................................. 2020-058087

(51) Int. Cl.
*H01L 21/3065* (2006.01)
*H01L 29/94* (2006.01)
*H01L 29/66* (2006.01)
*H01L 49/02* (2006.01)

(52) U.S. Cl.
CPC ........ *H01L 28/91* (2013.01); *H01L 21/30655* (2013.01); *H01L 28/84* (2013.01); *H01L 29/66181* (2013.01); *H01L 29/945* (2013.01); *H01L 28/75* (2013.01)

(58) Field of Classification Search
CPC ............. H01L 29/945; H01L 29/66181; H01L 28/90–92; H01L 28/40; H01L 21/30655; H01L 28/84
See application file for complete search history.

(56) References Cited

U.S. PATENT DOCUMENTS

| 6,025,225 A * | 2/2000 | Forbes .................... H01L 28/82 |
| | | 257/E21.651 |
| 10,510,828 B2 | 12/2019 | Akcasu |
| 2003/0052088 A1* | 3/2003 | Khan .................. H01L 21/3065 |
| | | 438/719 |
| 2003/0123216 A1* | 7/2003 | Yoon ....................... H01L 28/84 |
| | | 257/E21.018 |
| 2004/0159872 A1* | 8/2004 | Srividya ............. H10B 12/0387 |
| | | 257/E21.396 |
| 2012/0127625 A1 | 5/2012 | Wang et al. |
| 2014/0145305 A1* | 5/2014 | Lehnert .................... H01L 28/60 |
| | | 257/532 |
| 2017/0186837 A1* | 6/2017 | Yen ....................... H01L 23/535 |

\* cited by examiner

*Primary Examiner* — Jose R Diaz
(74) *Attorney, Agent, or Firm* — Rabin & Berdo, P.C.

(57) ABSTRACT

A semiconductor device has: a semiconductor substrate; a trench that extends from a first surface of the semiconductor substrate towards an interior of the semiconductor substrate, and that has a recess/protrusion structure on a side wall surface thereof; a semiconductor film that is formed so as to cover the side wall surface of the trench, be continuous with the side wall surface, and extend onto the first surface of the semiconductor substrate; an opposite electrode having a first portion that is provided at a position opposing the semiconductor substrate while sandwiching the semiconductor film therebetween, and that extends on the first surface of the semiconductor substrate, and a second portion that is continuous with the first portion and extends so as to fill the trench; and an insulating film that insulates the semiconductor film from the opposite electrode.

6 Claims, 15 Drawing Sheets

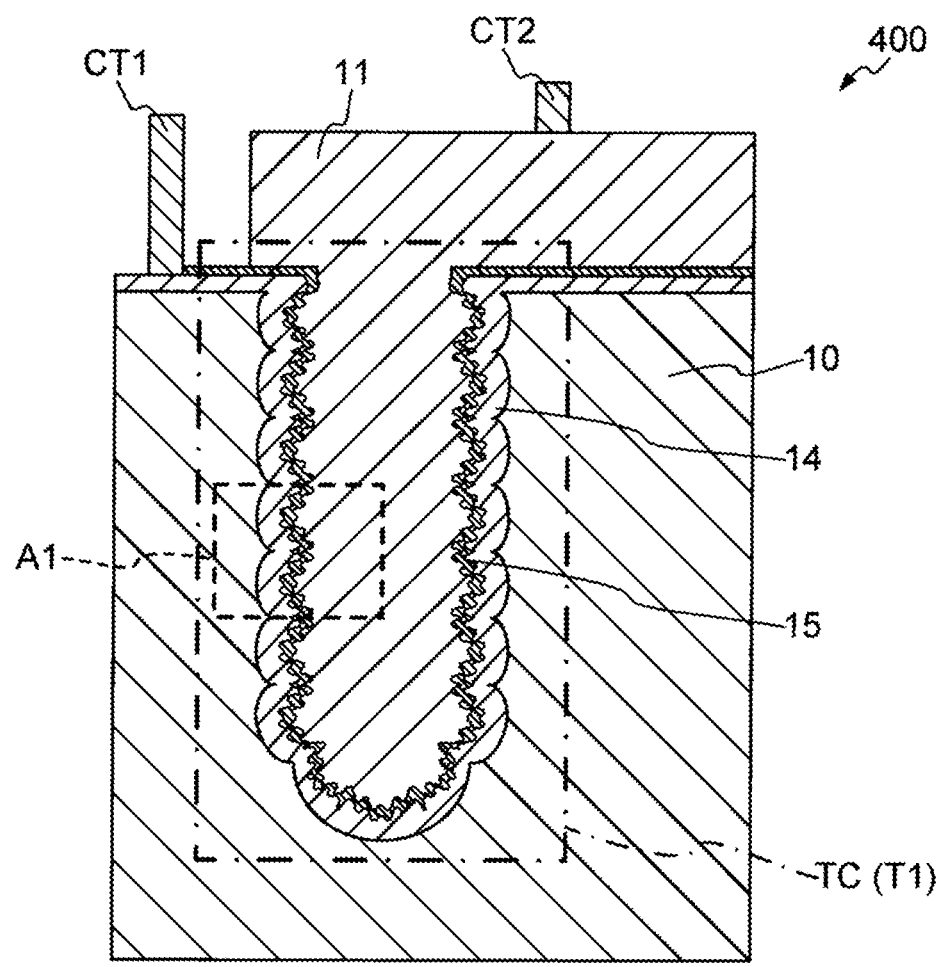

SEMICONDUCTOR DEVICE AND MANUFACTURING METHOD FOR SEMICONDUCTOR DEVICE

CROSS REFERENCE TO RELATED APPLICATION

This application is based upon and claims the benefit of priority of the prior Japanese Patent Application No. 2020-058087, filed on Mar. 27, 2020, the entire contents of which are incorporated herein by reference.

TECHNICAL FIELD

The present invention relates to a semiconductor device and a manufacturing method for a semiconductor device.

BACKGROUND ART

In improving semiconductor manufacturing techniques, there has been increased density whereby more and higher performance elements are installed per unit area of a circuit (unit information projected area). Regarding capacitor elements used in semiconductor memory or the like, a method is known in which a trench is formed in the semiconductor substrate to increase the surface area by forming a 3-dimensional structure and increase the capacitance density per unit area.

In the area of micro-electro-mechanical systems (MEMS), Bosch etching is a known technique for processing semiconductor substrates. In Bosch etching, the semiconductor substrate is etched by repeating the etching step and the side wall passivation step, to form a trench in the semiconductor substrate. Scale-like recesses and protrusions (scallops) are formed in the side surfaces of the trench formed by the Bosch etching technique.

The surface in which the scallops are formed has a greater surface area than a smooth surface. A method by which a trench is formed by Bosch etching to increase the surface area through the formation of a scallop structure in the side wall portion to increase the capacitance of the trench capacitor has been proposed (U.S. Patent Application Publication No. 2012/0127625, U.S. patent Ser. No. 10/510,828, for example).

SUMMARY OF THE INVENTION

A scale-like recess/protrusion structure formed by Bosch etching has protrusions, the tips of which have an acute angle (that is, the tips are pointed). Thus, if a capacitor (trench capacitor) is formed by a trench having a recess/protrusion structure in the side wall surface, the capacitor insulating film formed on the side wall surface of the trench is thinned in portions where the recess/protrusion structure has acute angles. Also, if a voltage is applied to the opposite electrode, an electric field is concentrated in the portions with acute angles. Both of these issues are linked to reduced breakdown voltage in the capacitor insulating film.

Also, the side wall surface on which the recess/protrusion structure is formed by Bosch etching has micro-recesses/protrusions that are smaller than the recess/protrusion structure and that would be recognized as surface roughness. Thinning of the capacitor insulating film and concentration of electric fields also occurs in the angled sections of the micro-recesses/protrusions, which is also a factor that reduces the breakdown voltage of the capacitor insulating film.

The present invention takes into consideration these problems, and an object thereof is to provide a semiconductor device that can mitigate a reduction in breakdown voltage of the capacitor insulating film while increasing the capacitance of the trench capacitor.

A semiconductor device according to the present invention includes: a semiconductor substrate; a trench that extends from a first surface of the semiconductor substrate towards an interior of the semiconductor substrate, and that has a recess/protrusion structure on a side wall surface thereof; a semiconductor film that is formed so as to cover the side wall surface of the trench, be continuous with the side wall surface, and extend onto the first surface of the semiconductor substrate; an opposite electrode having a first portion that is provided at a position opposing the semiconductor substrate while sandwiching the semiconductor film therebetween, and that extends on the first surface of the semiconductor substrate, and a second portion that is continuous with the first portion and extends so as to fill the trench; and an insulating film that insulates the semiconductor film from the opposite electrode.

Also, a manufacturing method for a semiconductor device according to the present invention includes: a step of forming a trench that extends towards an interior of a semiconductor substrate from a first surface of the semiconductor substrate through Bosch etching; a step of forming a semiconductor film so as to cover the side wall surface of the trench, be continuous with the side wall surface, and extend onto the first surface of the semiconductor substrate; a step of forming an insulating film on a surface of the semiconductor film; and a step of forming, on the insulating film, an opposite electrode having a first portion that extends on the first surface of the semiconductor substrate and a second portion that is continuous with the first portion and extends so as to fill the trench.

According to the semiconductor device of the present embodiment, it is possible to increase the capacitance per unit area of the trench capacitor while mitigating a reduction in breakdown voltage of the capacitor insulating film.

BRIEF DESCRIPTION OF THE DRAWINGS

FIG. 10 is a cross-sectional view showing a structure of a semiconductor device according to Embodiment 4 of the present invention.

DETAILED DESCRIPTION OF EMBODIMENTS

Figure 1A:
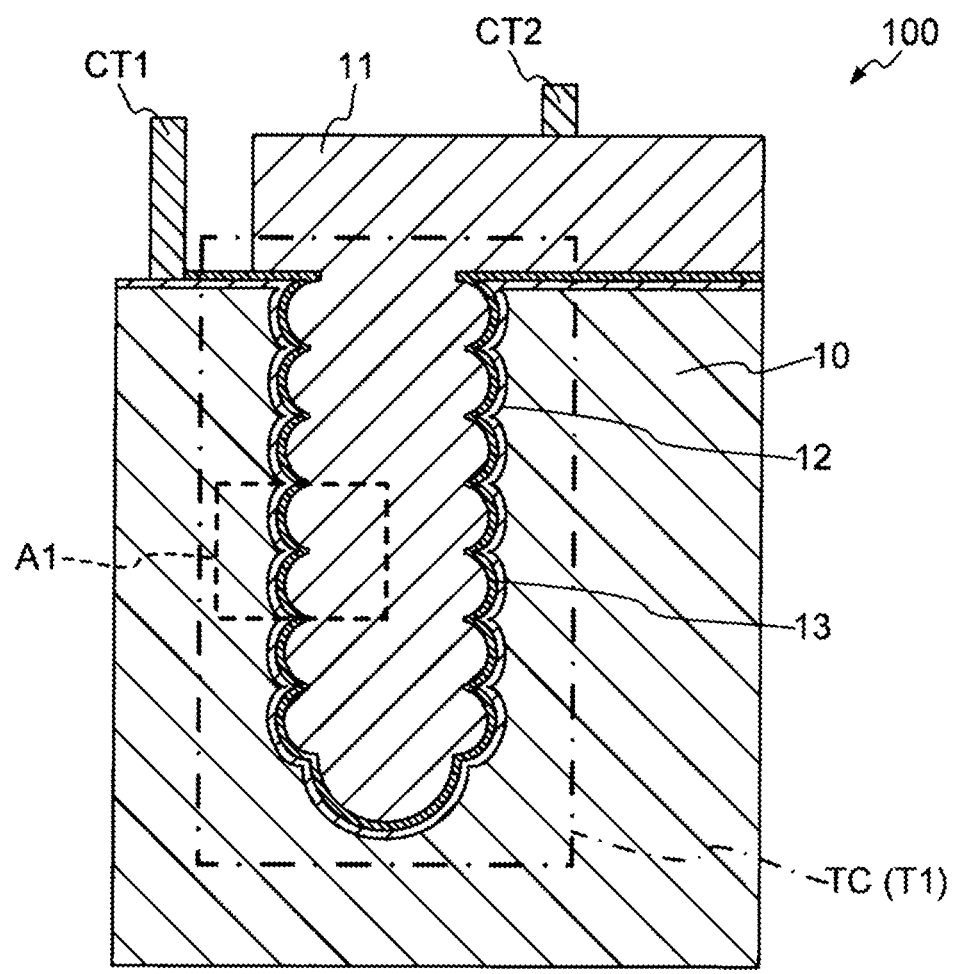
FIG. 1A is a cross-sectional view showing a structure of a semiconductor device according to Embodiment 1 of the present invention.

A suitable embodiment of the present invention will be explained below in detail. In the description of embodiments and the affixed drawings below, parts that are substantially the same or equivalent to each other are assigned the same reference characters.

Embodiment 1

FIG. 1A is a cross-sectional view showing the configuration of a semiconductor device 100 according to Embodiment 1 of the present invention. The semiconductor device 100 includes a semiconductor substrate 10 and an opposite electrode 11. The semiconductor substrate 10 has formed therein a trench capacitor TC.

The semiconductor substrate 10 is a silicon (Si) substrate, for example. The surface of the semiconductor substrate 10 on which elements are installed (hereinafter referred to as the first surface) has formed thereon a polysilicon film 12 and a capacitor insulating film 13.

The first surface of the semiconductor substrate 10 has formed therein a trench-type recess (hereinafter referred to as a trench T1) that extends towards the interior. The trench T1 constitutes the trench capacitor TC together with the polysilicon film 12 and the capacitor insulating film 13 formed on the surface thereof.

The trench T1 is formed by performing trench processing through Bosch etching of the semiconductor substrate 10. In Bosch etching, the substrate is etched by repeating the etching step and the side wall passivation step. As a result, the etched side surfaces have scale-like recesses and protrusions (scallops) formed therein.

Thus, the trench T1 of the present embodiment has a recess/protrusion structure on the side wall surface in which a plurality of recesses and protrusions are formed thereon. In the recess/protrusion structure, the recesses have a relatively rounded shape, whereas the protrusions have an acute-angled tip (that is, a pointed shape). In other words, the width of the protrusions in the recess/protrusion structure in the side wall surface of the trench T1 is less than the width of the recesses. Each of the recesses has a size of 1-2 μm, for example.

The opposite electrode 11 is made of polysilicon (poly-Si). The opposite electrode 11 is formed so as to oppose the semiconductor substrate 10 across the capacitor insulating film 13 and the polysilicon film 12. The opposite electrode 11 has a flat portion (first portion) formed so as to extend on the first surface of the semiconductor substrate 10, and a portion (second portion) that extends towards the interior of the semiconductor substrate 10 so as to be continuous with the flat portion while filling the trench of the semiconductor substrate 10.

The polysilicon film 12 is a semiconductor film that is formed so as to cover the interior surface (in particular, the side wall surface) of the trench T1 and so as to extend on the first surface of the semiconductor substrate 10. In the present embodiment, the polysilicon film 12 is a non-doped polysilicon film that has not been doped with impurities. Through LP-CVD, the polysilicon film 12 is formed by directly depositing non-doped polysilicon on the surface of the semiconductor substrate 10 in which the trench T1 has been formed.

The capacitor insulating film 13 is an insulating film provided between the opposite electrode 11 and the polysilicon film 12. The capacitor insulating film 13 is formed on the surface of the polysilicon film 12 so as to cover the interior surface of the trench T1 and so as to extend on the first surface of the semiconductor substrate 10. The capacitor insulating film 13 is an insulating film such as a silicon nitride (SiN) film, for example, and is formed by directly depositing SiN through LP-CVD, for example, onto the surface of the polysilicon film 12.

A contact CT1 is provided on the first surface of the semiconductor substrate 10. The contact CT1 is a substrate-side contact to which a voltage is applied, and is connected to the semiconductor substrate 10 via the polysilicon film 12.

A contact CT2 is provided on the surface of the flat portion of the opposite electrode 11 (the surface opposite to that facing the semiconductor substrate 10). The contact CT2 is an electrode-side contact to which a voltage is applied, and is connected to the opposite electrode 11. The contacts CT1 and CT2 are made of a conductor such as tungsten, for example.

As described above, in the semiconductor device 100 of the present embodiment, the trench T1 is formed in the semiconductor substrate 10 through Bosch etching, and the characteristics of Bosch etching result in a scale-like recess/protrusion structure ("scallops") formed on the side wall of the trench T1.

Thus, the trench T1 of the present embodiment has a greater surface area compared to a trench with a smooth side wall that does not have such a recess/protrusion structure. Therefore, the trench capacitor TC of the present embodiment has a greater capacitance compared to trench capacitors in which the side wall surface of the trench does not have such a recess/protrusion structure.

The side wall surface of the trench T1 has formed thereon the polysilicon film 12, and additionally, the capacitor insulating film 13 is formed on the polysilicon film 12. The polysilicon film 12 is a non-doped polysilicon film, and functions similarly to the semiconductor substrate 10 when a voltage is applied to the opposite electrode 11. In other words, the trench capacitor TC of the present embodiment has the property that the capacitance thereof changes depending on the voltage applied to the opposite electrode 11 (C-V characteristics of a so-called MOS capacitor).

Figure 1B:
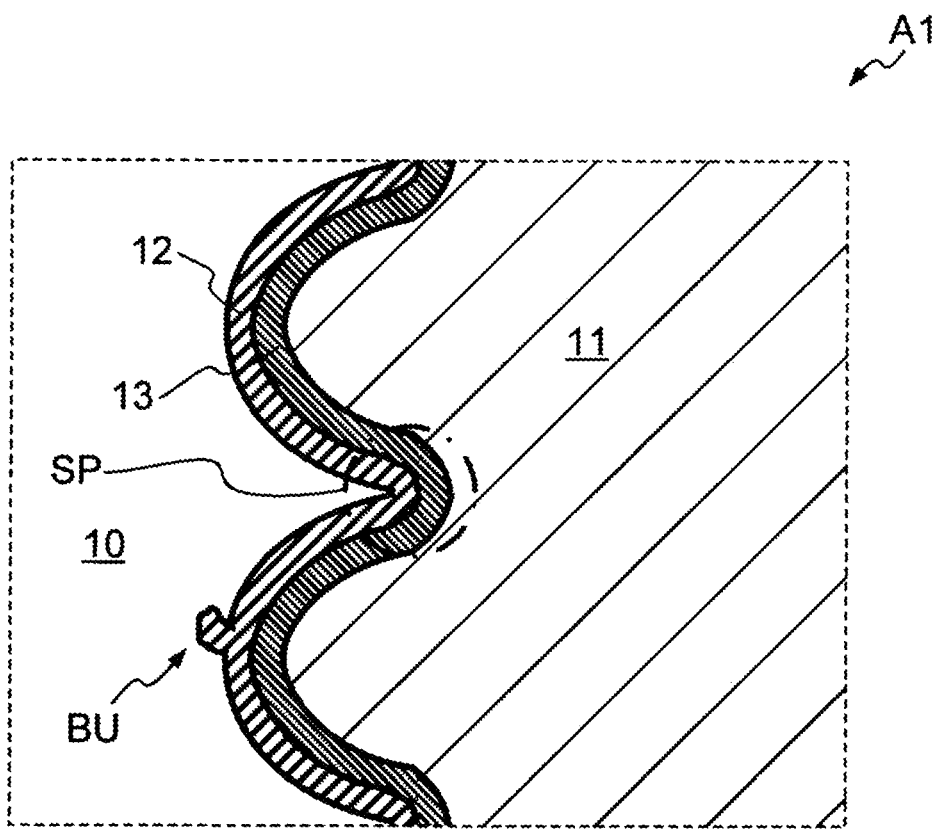
FIG. 1B is an enlarged view of the section of FIG. 1A surrounded by the broken line.

FIG. 1B is an enlarged view of the section A1 of FIG. 1A surrounded by the broken line. Here, the shading of the semiconductor substrate 10 is omitted.

As described above, in the semiconductor device 100 of the present embodiment, the trench T1 is formed in the semiconductor substrate 10 through Bosch etching. As a result, the side wall of the trench T1 has a recess/protrusion structure ("scallops"). Also, as a result of the characteristics of Bosch etching, the surface of the side wall has a micro-recess/protrusion section (hereinafter referred to as a micro-recess/protrusion BU) that is even smaller than the recess/protrusion structure. This micro-recess/protrusion BU is an irregular micro-recess/protrusion at a level recognized as so-called surface roughness, and has a shape with acute angles.

The polysilicon film 12 is formed on the side wall surface of the trench T1 so as to cover, in a rounded fashion, the acute angle portion (protrusion of pointed shape section indicated as SP in FIG. 1B, for example) while maintaining the shape of the recess/protrusion structure, as a result of the deposition characteristics of LP-CVD. Also, the micro-recess/protrusion BU, which is thinner than the polysilicon film 12, is embedded as a result of the deposition characteristics of LP-CVD, causing the side wall surface of the section where the micro-recess/protrusion BU is formed to be smoothed.

Figure 2:
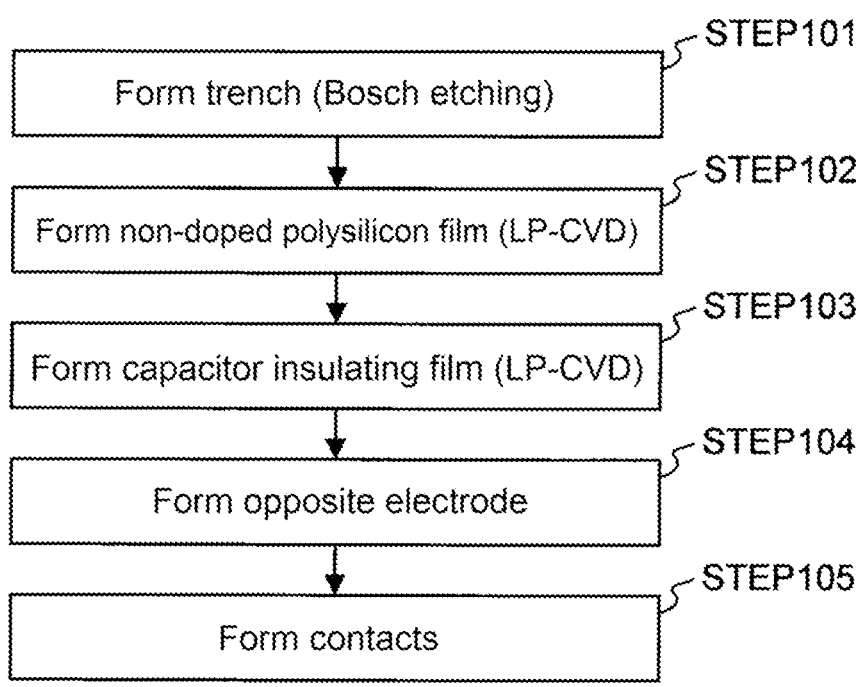
FIG. 2 is a flowchart showing manufacturing steps for the semiconductor device according to Embodiment 1.

Next, a manufacturing method for the semiconductor device 100 of the present embodiment will be described with reference to the flowchart of FIG. 2.

First, Bosch etching is performed on the semiconductor substrate 10 to form a trench (STEP 101). In other words, the etching step and the passivation step are repeated to form a trench in the semiconductor substrate 10. As a result, the trench T1 having the recess/protrusion structure is formed in the side wall portion.

Next, through LP-CVD, a non-doped polysilicon film is formed on the surface of the semiconductor substrate 10 including the inner wall of the trench T1 (STEP 102). As a result, the polysilicon film 12 is formed on the surface of the semiconductor substrate 10.

Next, through LP-CVD, a silicon nitride film (SiN) is formed on the surface of the polysilicon film 12 (STEP 103). At this time, the silicon nitride film is formed upon performing patterning such that a portion of the polysilicon film 12 at the location where the contact CT1 is to be formed is exposed at the wafer surface. As a result, the capacitor insulating film 13 is formed.

Next, a polysilicon layer is formed on the surface of the capacitor insulating film 13 so as to fill the interior of the trench T1 and so as to extend on the first surface of the semiconductor substrate 10. As a result, the opposite electrode 11 made of polysilicon is formed (STEP 104).

Next, contact holes are formed in the surface of the polysilicon film 12 and the surface of the opposite electrode 11 that are exposed at the wafer surface, and the contact holes are filled by a conductor such as tungsten. As a result, the contacts CT1 and CT2 are formed (STEP 105).

Through these steps, the semiconductor device 100 of the present embodiment is produced.

In the semiconductor device 100 of the present embodiment, the capacitor insulating film 13 is formed on the surface of the polysilicon film 12, and thus, the breakdown voltage of the capacitor insulating film 13 in the trench capacitor TC is higher compared to a case in which a similar polysilicon film is not formed. This will be explained below.

Figure 3A:
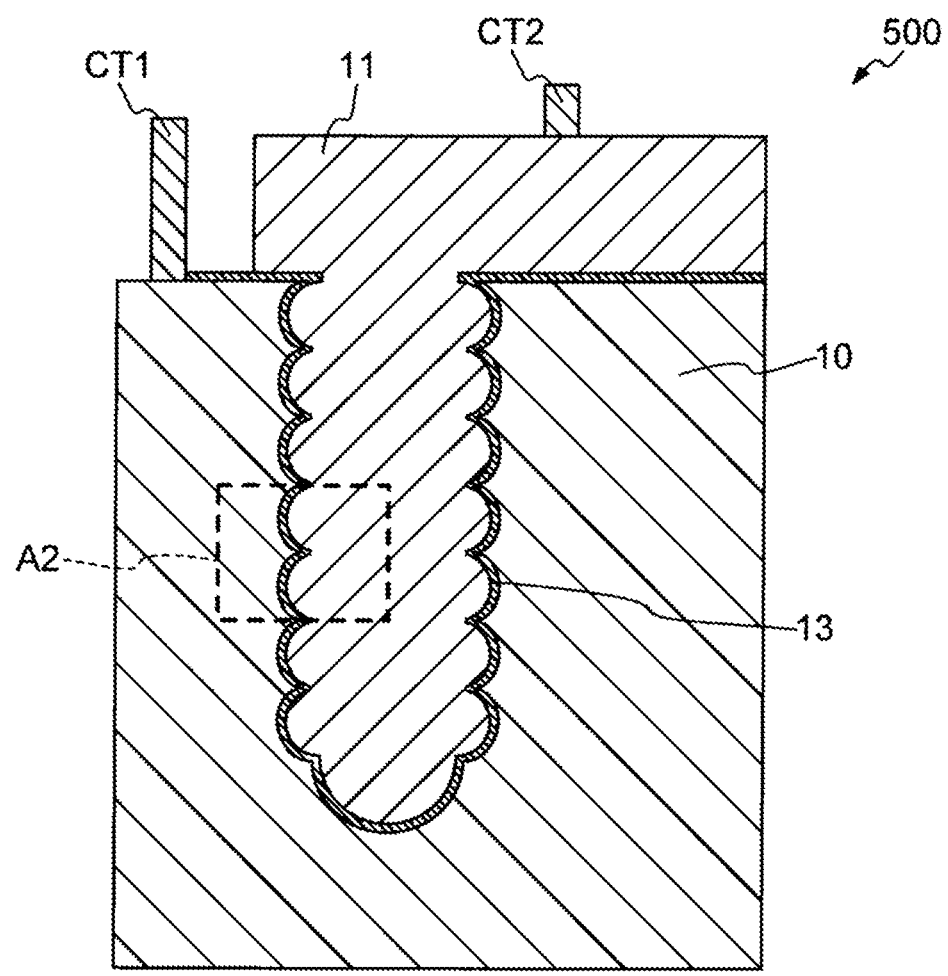
FIG. 3A is a cross-sectional view showing a structure of a semiconductor device according to a comparison example.

FIG. 3A is a cross-sectional configuration of a semiconductor device 500 according to a comparison example in which the polysilicon film of the present embodiment is not formed.

In the semiconductor device 500 of the comparison example, a trench is formed in the semiconductor substrate 10 through Bosch etching and a scale-like recess/protrusion structure (scallops) is formed on the side wall of the trench. This aspect is similar to the semiconductor device 100 of the present embodiment.

However, in the semiconductor device 500 of the comparison example, the surface of the side wall portion of the trench T1 does not have formed thereon a polysilicon film, and only the capacitor insulating film 13 is formed. In other words, the semiconductor substrate 10 opposes the opposite electrode 11 across the capacitor insulating film 13.

Figure 3B:
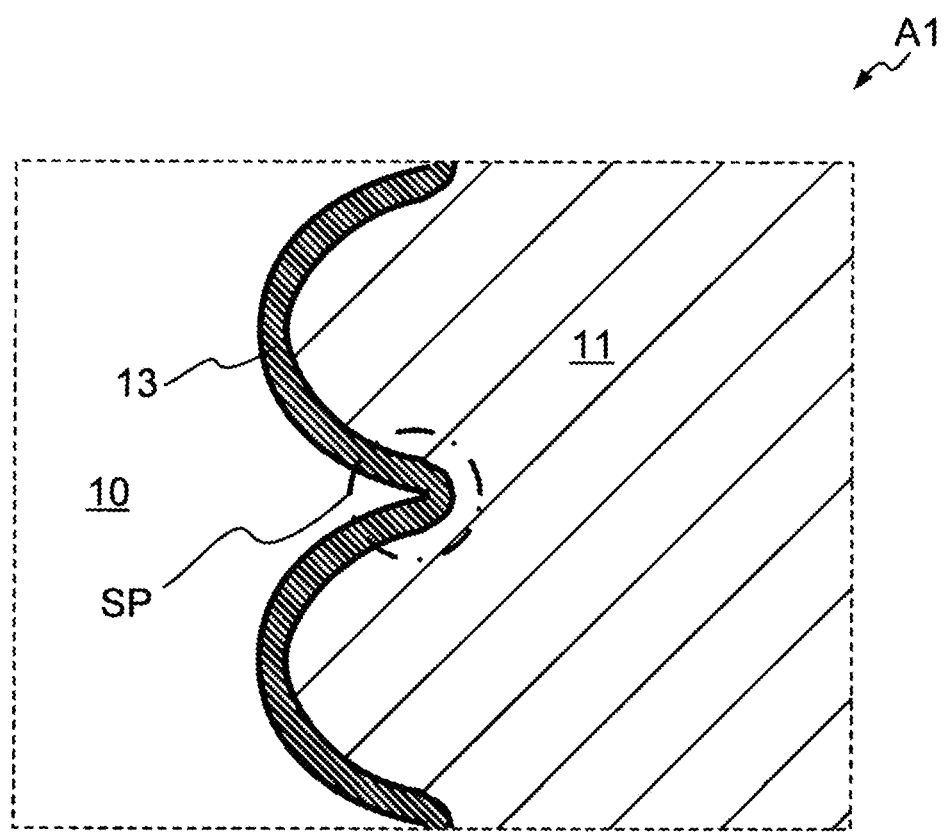
FIG. 3B is an enlarged view of the section of FIG. 3A surrounded by the broken line.

FIG. 3B is an enlarged view of the section A1 of FIG. 3A surrounded by the broken line. In the semiconductor device 500 of the comparison example, the capacitor insulating film 13 is directly formed on the side wall surface of the trench having the recess/protrusion structure that was formed by Bosch etching. As a result, the capacitor insulating film 13 is partially thinned at acute angle portions of the recess/protrusion structure on the trench side wall surface (near the tip of the protrusion indicated as SP in FIG. 3B, for example).

When applying a voltage to the opposite electrode 12 via the contacts CT1 and CT2, an electric field is concentrated on the acute angle portions (that is, the vicinity of the tips of the protrusions) of the recess/protrusion structure of the trench side wall. As a result of the partial thinning of the capacitor insulating film 13 and the concentration of the electric field in the acute angle portions when applying a voltage, the breakdown voltage of the capacitor insulating film 13 is reduced.

Also, even more minute recesses and protrusions are formed in the side wall surface having the recess/protrusion structure of the trench formed through Bosch etching, and the capacitor insulating film 13 is thinned in such micro-recesses/protrusions and electric fields are concentrated there.

Figure 4A:
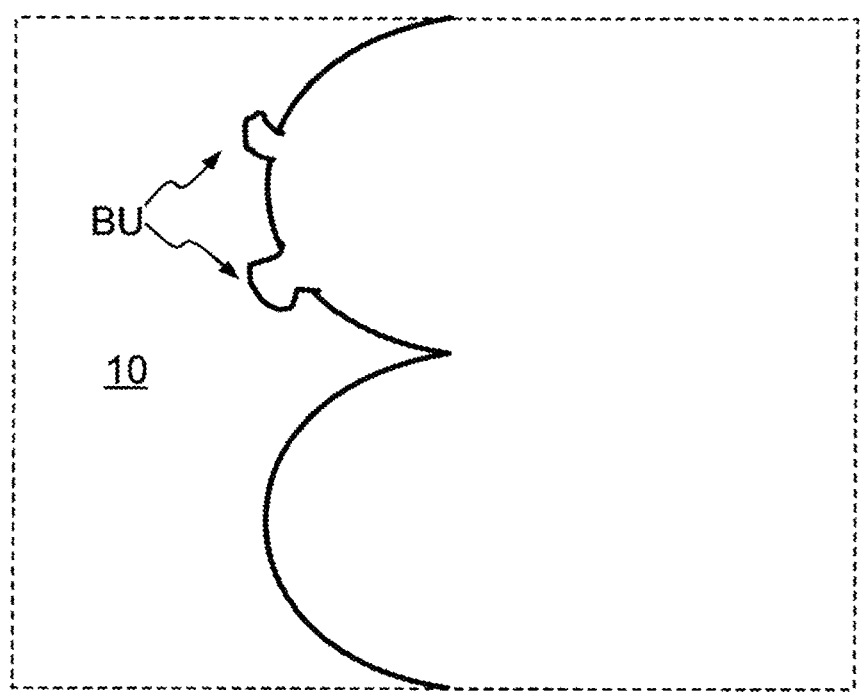
FIG. 4A is a cross-sectional view that schematically shows a section of a substrate surface of a trench capacitor according to the comparison example.

FIG. 4A schematically shows the surface of the trench immediately after Bosch etching (that is, immediately before formation of the capacitor insulating film 13 and the opposite voltage 12). Micro-recesses/protrusions BU are formed on the side wall surface of the trench having the recess/protrusion structure due to the characteristics of Bosch etching.

Figure 4B:
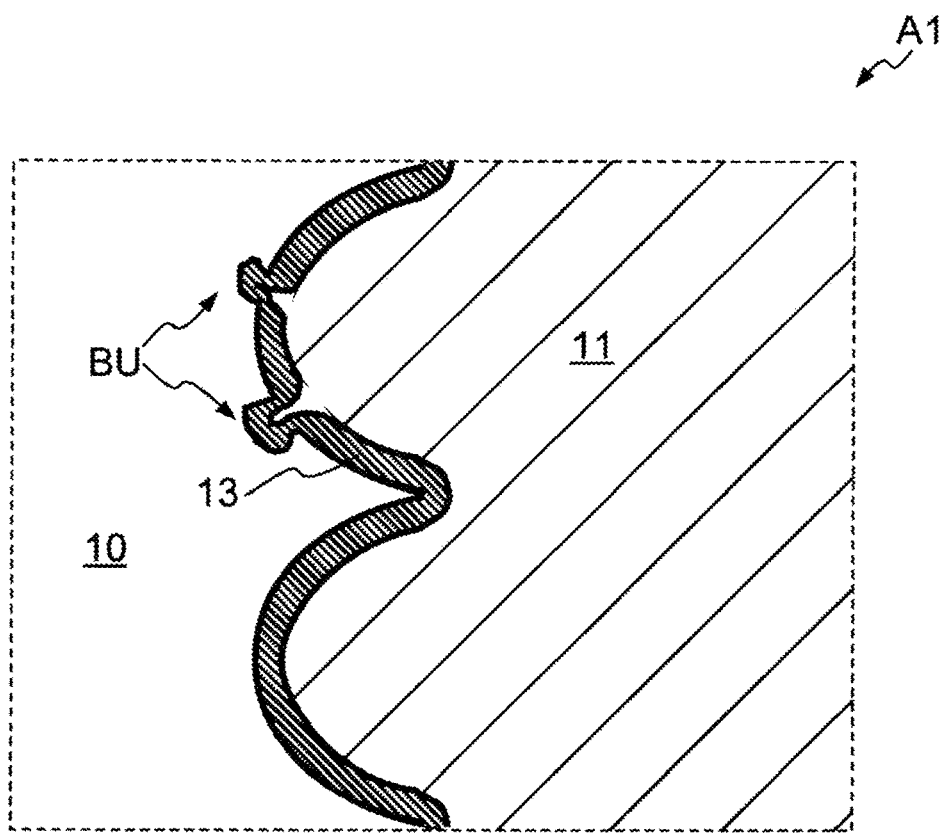
FIG. 4B is an enlarged cross-sectional view of a section of the surface of the trench capacitor according to the comparison example.

FIG. 4B schematically shows the surface of the trench capacitor after forming the opposite electrode. In the semiconductor device 500 of the comparison example, the capacitor insulating film 13 is directly formed on the side wall surface of the trench. As a result, the capacitor insulating film 13 formed on the micro-recess/protrusions BU is thinned. When voltage is applied to the opposite electrode 12, an electric field is concentrated at the micro-recesses/protrusions BU. Thus, as a result of the thinning of the capacitor insulating film 13 at the micro-recesses/protrusions BU and the concentration of the electric field there, the breakdown voltage of the capacitor insulating film 13 is reduced.

By contrast, as shown in FIG. 1B, in the semiconductor device 100 of the present embodiment, the polysilicon film 12 is formed so as to cover in a rounded fashion the acute angle sections of the recess/protrusion structure of the trench T1 (near the tips of the protrusions indicated as SP in FIG. 1B, for example). The micro-recess/protrusion BU formed on the surface of the recess/protrusion structure is thinner than the polysilicon film 12, and thus, is embedded in and smoothed by the polysilicon film 12.

The capacitor insulating film 13 is formed on the surface of this polysilicon film 12, and is not directly formed on the surface of the micro-recess/protrusion BU or acute angle sections of the recess/protrusion structure in the side wall of the trench T1. As a result, unlike the semiconductor device 500 of the comparison example, no partial thinning occurs in the capacitor insulating film 13, and no concentration of the electric field occurs when a voltage is applied.

Thus, according to the semiconductor device 100 of the present embodiment, thinning of the capacitor insulating film 13 and reduction of the breakdown voltage of the capacitor insulating film 13 resulting from the concentration of the electric field during application of a voltage do not occur.

As described above, in the semiconductor device 100 of the present embodiment, the recess/protrusion structure is formed on the side wall of the trench T1, and the surface area of the trench is greater than a case in which the side wall surface of the trench is formed as a smooth surface, and thus, the trench capacitor has a greater capacitance.

Also, in the semiconductor device 100 of the present embodiment, the polysilicon film 12 is formed on the surface of the semiconductor substrate 10 including the inner wall of the trench T1, and the capacitor insulating film 13 is formed on the polysilicon film 12. As a result, the semiconductor device 100 of the present embodiment does not undergo a thinning of the capacitor insulating film or a reduction in breakdown voltage in the capacitor insulating film resulting from a concentration of the electric field during application of the voltage, which are issues when directly forming the capacitor insulating film on the side wall surface of the trench having the recess/protrusion structure.

Thus, according to the semiconductor device 100 of the present embodiment, it is possible to mitigate a reduction in breakdown voltage of the capacitor insulating film while increasing the capacitance per unit area of the trench capacitor TC.

Embodiment 2

Figure 5A:
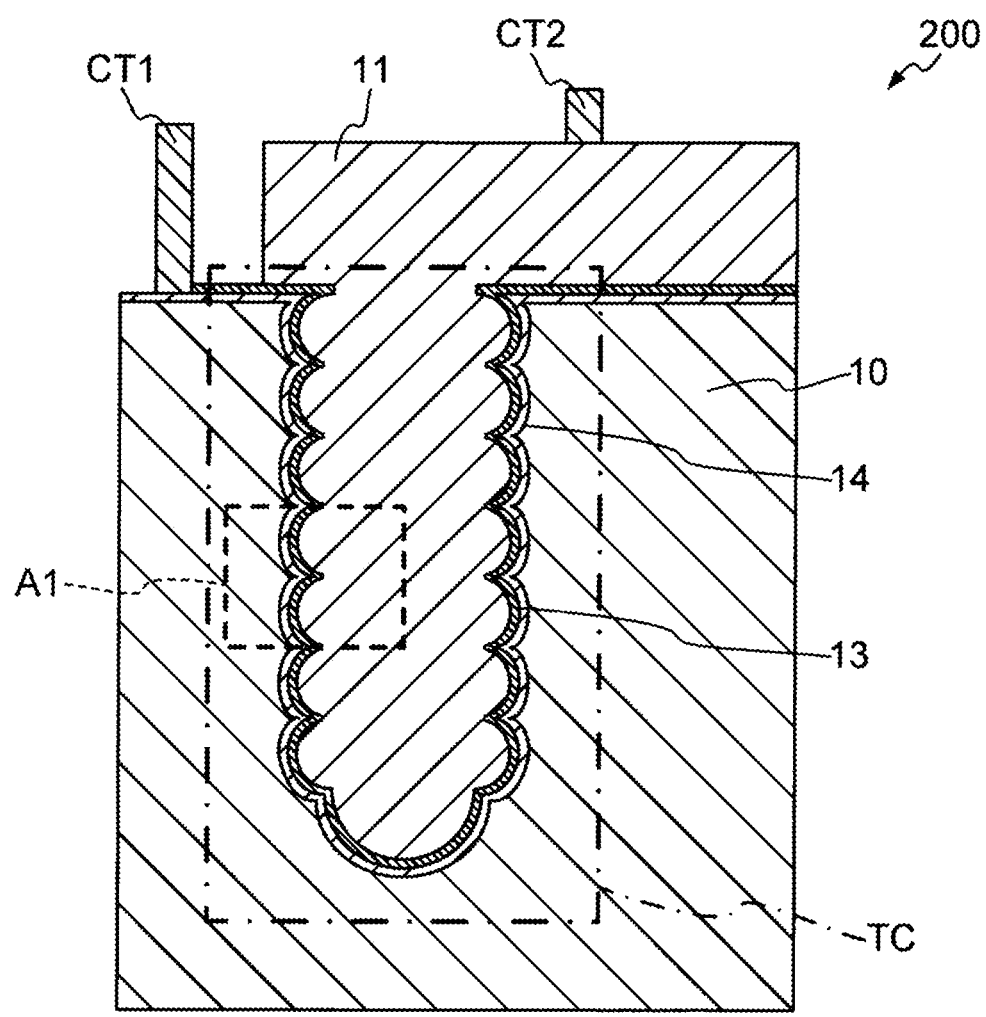
FIG. 5A is a cross-sectional view showing a structure of a trench capacitor according to Embodiment 2 of the present invention.

Next, Embodiment 2 of the present invention will be explained. FIG. 5A is a cross-sectional view showing the configuration of a semiconductor device 200 according to Embodiment 2 of the present invention.

In the semiconductor device 200 of the present embodiment, a polysilicon film 14 that is made of polysilicon doped with impurities (doped poly-Si) is formed on the surface of the semiconductor substrate 10 including the inner wall of the trench T1. That is, the semiconductor device 200 of the present embodiment differs from the semiconductor device 100 of Embodiment 1 in that the polysilicon film formed on the surface of the semiconductor substrate 10 is made of polysilicon doped with impurities rather than a non-doped polysilicon.

Figure 6:
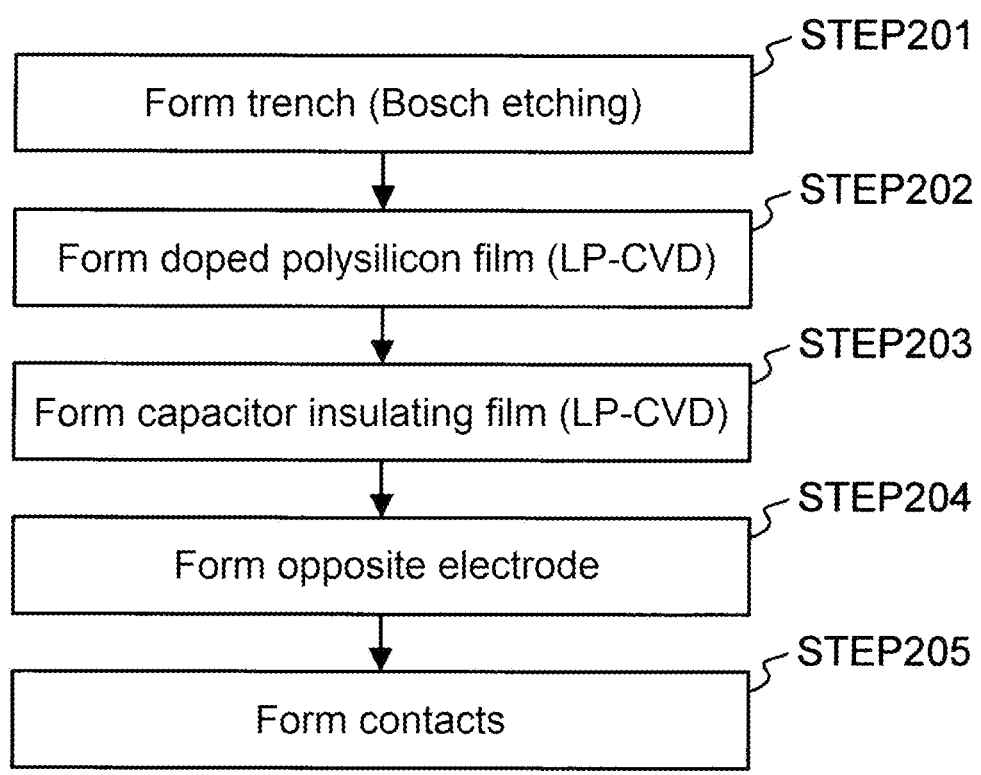
FIG. 6 is a flowchart showing manufacturing steps for the semiconductor device according to Embodiment 2.

FIG. 6 is a flowchart showing a manufacturing method for the semiconductor device 200 according to the present embodiment.

First, Bosch etching is performed on the semiconductor substrate 10 to form a trench (STEP 201). As a result, the trench T1 having the recess/protrusion structure in the side wall of the trench is formed.

Next, through LP-CVD, the polysilicon film 14, which is a polysilicon film doped with impurities, is formed on the surface of the semiconductor substrate 10 including the inner wall of the trench T1 (STEP 202). The polysilicon film 14 is formed by introducing, into the source gas, impurities for increasing conductivity while depositing polysilicon through LP-CVD, for example.

Thereafter, the semiconductor device 200 of the present embodiment is produced through STEPs 203 to 205. STEPs 203 to 205 are similar to STEPs 103 to 105 (see FIG. 2) of Embodiment 1, and thus, descriptions thereof are omitted here.

Figure 5B:
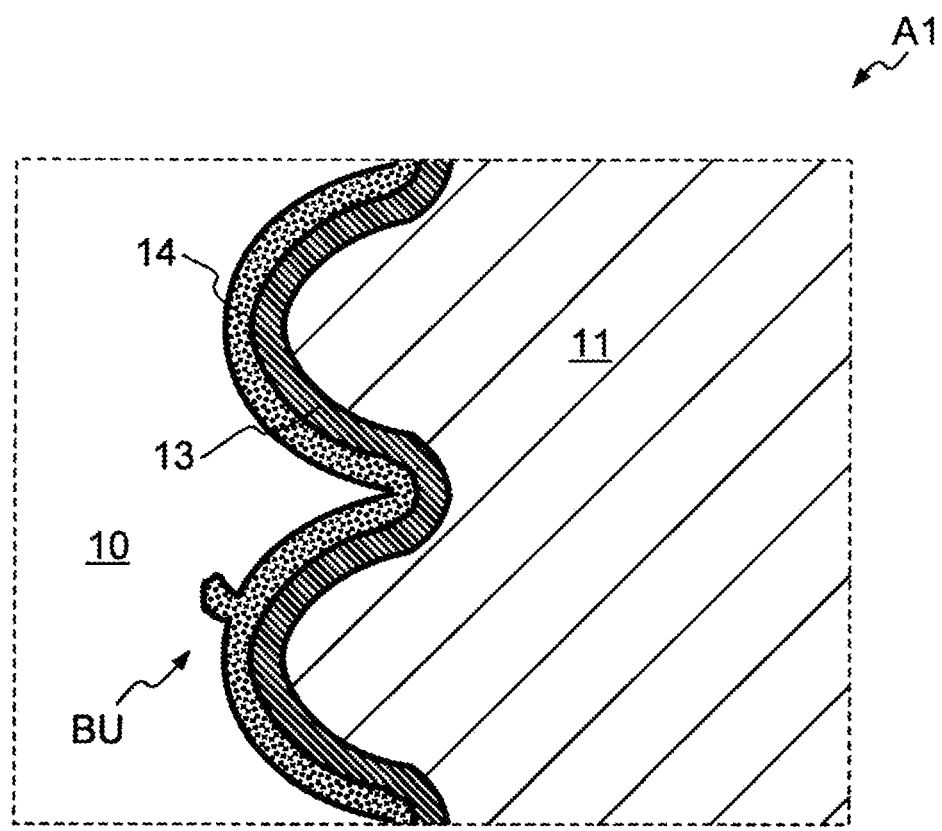
FIG. 5B is an enlarged view of the section of FIG. 5A surrounded by the broken line.

FIG. 5B is an enlarged view of the section A1 of FIG. 5A surrounded by the broken line. Here, the shading of the semiconductor substrate 10 is omitted.

Similar to the polysilicon film 12 of Embodiment 1, the polysilicon film 14 is formed on the side wall surface of the trench T1 so as to cover, in a rounded fashion, the acute angle portion (that is, the area near the tip of the protrusion) while maintaining the shape of the recess/protrusion structure as a result of the deposition characteristics of LP-CVD. Also, the micro-recess/protrusion BU, which is thinner than the polysilicon film 14, is embedded as a result of the deposition characteristics of LP-CVD, causing the side wall surface of the section where the micro-recess/protrusion BU is formed to be smoothed.

The capacitor insulating film 13 is formed on the surface of the polysilicon film 14. That is, the capacitor insulating film 13 is not directly formed on the surface of the micro-recess/protrusion BU or acute angle sections of the recess/protrusion structure in the side wall surface of the trench T1. As a result, similar to Embodiment 1, no partial thinning occurs in the capacitor insulating film 13, and no concentration of the electric field occurs when a voltage is applied.

Thus, similar to the semiconductor device 100 of Embodiment 1, according to the semiconductor device 200 of the present embodiment, it is possible to mitigate a reduction in breakdown voltage of the capacitor insulating film while increasing the capacitance per unit area of the trench capacitor TC.

On the other hand, the semiconductor device 200 of the present embodiment differs from the semiconductor device 100 of Embodiment 1 in that the semiconductor film formed on the side wall surface of the trench T1 in the semiconductor device 200 is the polysilicon film 14 made of polysilicon doped with impurities (doped poly-Si). That is, in the semiconductor device 200 of the present embodiment, a low resistance polysilicon film 14 that is made of polysilicon doped with impurities is formed on the substrate side in the side wall portion of the trench T1. Thus, when a voltage is applied to the opposite electrode 12, the trench capacitor TC operates as a MOS capacitor to store charge regardless of the applied voltage. In other words, in the trench capacitor TC of the present embodiment, a generally constant capacitance can be attained regardless of the voltage applied to the opposite electrode 12.

Thus, the semiconductor device 200 of the present embodiment can be used in cases, such as for a bypass capacitor, where a fluctuation in capacitance depending on the applied voltage is not desirable.

Embodiment 3

Figure 7:
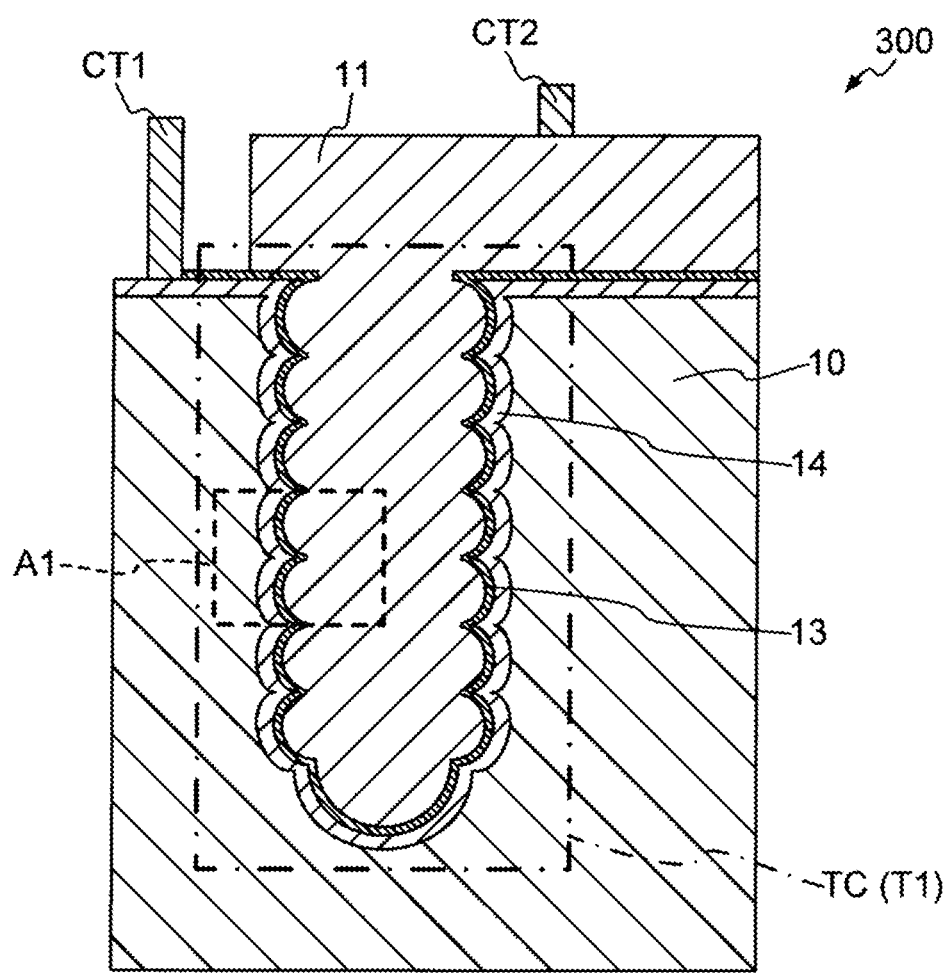
FIG. 7 is a cross-sectional view showing a structure of a semiconductor device according to Embodiment 3 of the present invention.

Next, Embodiment 3 of the present invention will be explained. FIG. 7 is a cross-sectional view showing the configuration of a semiconductor device 300 according to Embodiment 3 of the present invention.

In the semiconductor device 300 of the present embodiment, the polysilicon film 14 made of polysilicon doped with impurities is formed to be thicker than the polysilicon film 14 of Embodiment 2 (approximately double the thickness, for example). The difference in thickness between the polysilicon films 14 is a result of the difference in formation steps for the polysilicon films 14.

Figure 8:
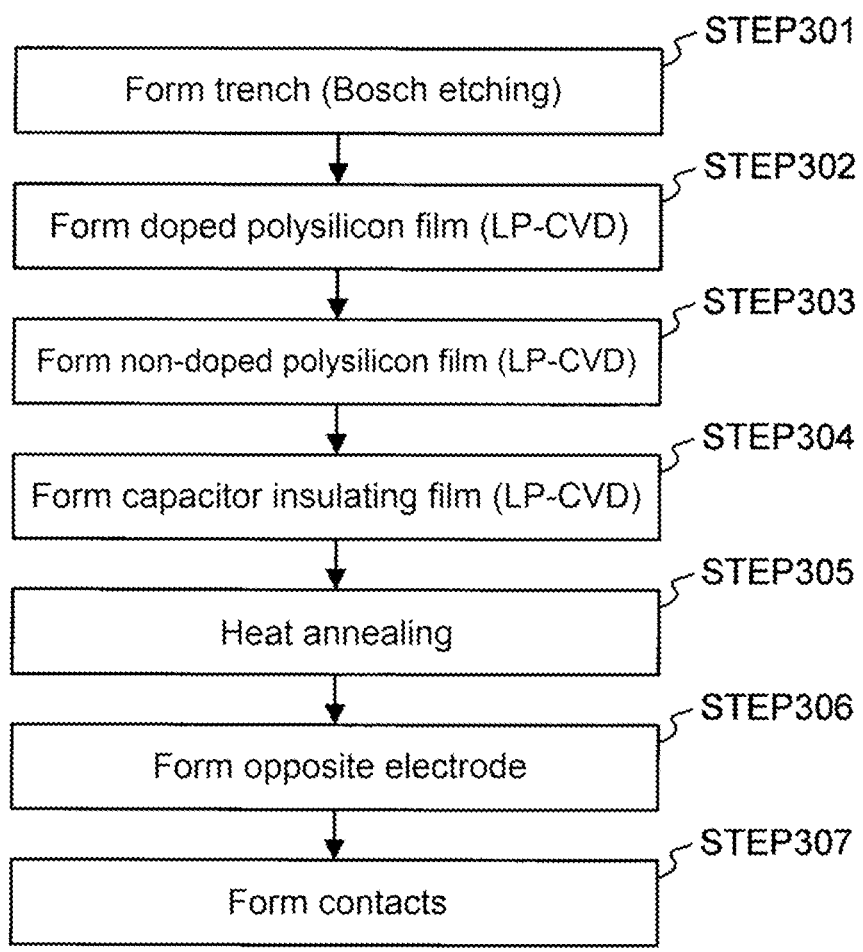
FIG. 8 is a flowchart showing manufacturing steps for the semiconductor device according to Embodiment 3.

FIG. 8 is a flowchart showing a manufacturing method for the semiconductor device according to the present embodiment.

First, Bosch etching is performed on the semiconductor substrate 10 to form a trench (STEP 301). As a result, the trench having the recess/protrusion structure in the side wall of the trench is formed.

Next, through LP-CVD, polysilicon is deposited through LP-CVD while introducing impurities thereto on the surface of the semiconductor substrate 10 including the inner wall of the trench (STEP 302). As a result, the polysilicon film 14, which is a polysilicon film doped with impurities, is formed.

Next, through LP-CVD, polysilicon is deposited on the surface of the polysilicon film 14 (STEP 303). In this case, unlike STEP 101, no impurities are introduced. As a result, a non-doped polysilicon film 12 is formed.

Next, through LP-CVD, a silicon nitride film (SiN) is formed on the surface of the polysilicon film 12 (STEP 304). As a result, the capacitor insulating film 13 is formed.

Figure 9A:
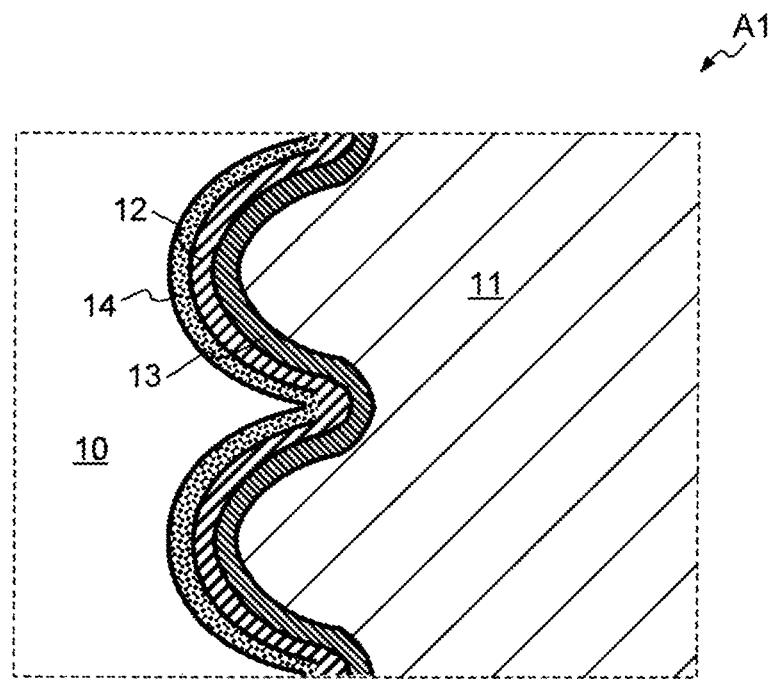
FIG. 9A is a cross-sectional view showing a section of a surface during the formation step for a capacitor insulating film of a trench capacitor according to Embodiment 3 of the present invention.

FIG. 9A is an enlarged cross-sectional view of a portion of the trench at the stage when the capacitor insulating film 13 has been formed in STEP 304.

The polysilicon film 14 doped with impurities is formed on the surface of the semiconductor substrate 10 in the interior of the trench. Additionally, the non-doped polysilicon film 12 is formed on the surface of the polysilicon film 14, and the capacitor insulating film 13 is formed on the polysilicon film 12.

With reference to FIG. 8, heat annealing is performed on the semiconductor substrate 10, the surface of which has formed sequentially thereon the polysilicon film 14 doped with impurities, the non-doped polysilicon film 12, and the capacitor insulating film 13 (STEP 305). As a result, the impurities in the polysilicon film 14 undergo solid-phase diffusion to the polysilicon film 12, resulting in both the polysilicon film 14 and the polysilicon film 12 being doped with the impurities. In other words, the entire two-layer film constituted of the non-doped polysilicon and the doped polysilicon (polysilicon doped with impurities) becomes doped polysilicon.

Thereafter, similar to Embodiment 1, the formation of the opposite electrode 11 (STEP 306) and the formation of the contacts CT1 and CT2 (STEP 307) are performed.

Figure 9B:
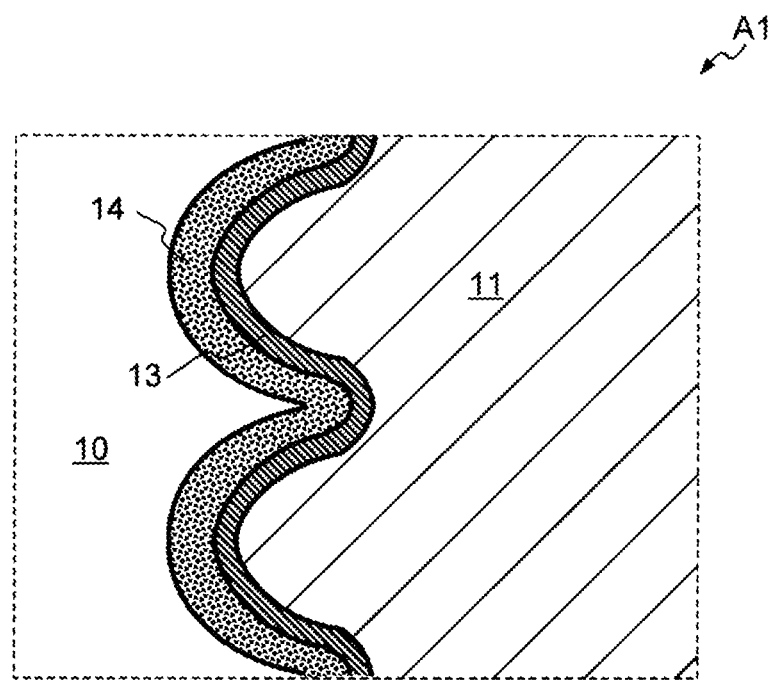
FIG. 9B is a cross-sectional view showing a section of a surface of the trench capacitor that has been annealed according to Embodiment 3 of the present invention.

FIG. 9B is an enlarged cross-sectional view of a portion of the trench of the semiconductor substrate 10 manufactured through these manufacturing steps. As a result of the heat annealing performed in STEP 305, the entire two-layer film constituted of the non-doped polysilicon and the doped polysilicon becomes doped polysilicon. Thus, the polysilicon film 14 doped with impurities is formed to a thickness of two layers on the surface of the semiconductor substrate 10 and the capacitor insulating film 13 is formed on the surface of the polysilicon film 14.

In the present embodiment, the capacitor insulating film 13 is formed on the surface of the non-doped polysilicon film 12, and then, is subjected to heat annealing such that the polysilicon film 12 is doped with impurities. Thus, at the stage of forming the capacitor insulating film 13, the surface therebelow is still a non-doped polysilicon film 12.

If, unlike the present embodiment, the capacitor insulating film were directly formed on the surface of a polysilicon film doped with impurities, deposition characteristics for the capacitor insulating film could be affected in localized areas where impurity atoms emerge at the surface of the polysilicon film. As a result, in some cases, the film characteristics of the capacitor insulating film could be reduced, thereby reducing the breakdown voltage.

However, according to the manufacturing method of the present embodiment, when forming the capacitor insulating film 13, the surface therebelow is the non-doped polysilicon film 12, and thus, no impurity atoms emerge from said surface. Thus, it is possible to avoid a reduction in film characteristics of the capacitor insulating film 13 resulting from impurity atoms.

In the present embodiment, the non-doped polysilicon film 12 is changed to the polysilicon film 14 that has been doped with impurities by heat annealing. As a result, after manufacturing the semiconductor device, a generally uniform capacitance can be attained regardless of the voltage applied to the opposite electrode 12, similar to Embodiment 2.

Also, in the semiconductor device of the present embodiment, a trench having a recess/protrusion structure is formed by Bosch etching, and the capacitor insulating film 13 is formed on the polysilicon film 14, which is formed on the surface of the semiconductor substrate including the inner wall of the trench. Thus, similar to Embodiments 1 and 2, it is possible to mitigate a reduction in breakdown voltage of the capacitor insulating film while increasing the capacitance per unit area of the trench capacitor TC.

Embodiment 4

Next, Embodiment 4 of the present invention will be explained. FIG. 10 is a cross-sectional view showing the configuration of a semiconductor device 400 according to Embodiment 2 of the present invention.

In the semiconductor device 400 of the present embodiment, a rough-surfaced polysilicon film is formed on the surface of the portion of the polysilicon film (polysilicon film 14 of Embodiment 3) at the inner wall portion of the trench T1, out of the entirety of the polysilicon film 14 formed on the surface of the semiconductor substrate 10. These together constitute a polysilicon film 15. The rough-surfaced polysilicon film is a polysilicon film in which the surface is roughened by hemispherical polysilicon grains, being made of HSG-Si (hemispherical grained Si), for example.

Figure 11:
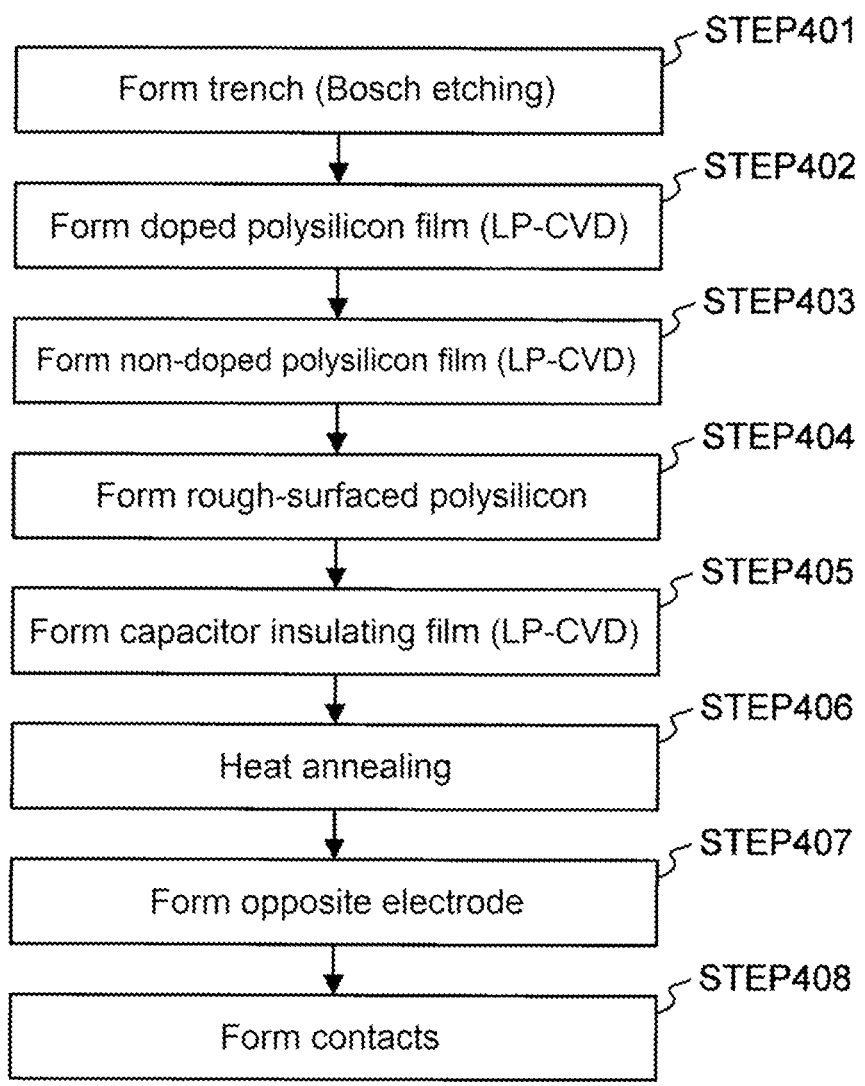
FIG. 11 is a flowchart showing manufacturing steps for the semiconductor device according to Embodiment 4.

FIG. 11 is a flowchart showing a manufacturing method for the semiconductor device according to the present embodiment.

STEPs 401 to 403 are similar to STEPs 301 to 303 of Embodiment 3. That is, after forming a trench through Bosch etching (STEP 401), the polysilicon film 14, which is doped with impurities, is formed on the surface of the semiconductor substrate 10 through LP-CVD (STEP 402). Then, through LP-CVD, a non-doped polysilicon film 12 is formed on the polysilicon film 14 (STEP 403).

Next, the polysilicon film 12 formed in STEP 403 is smoothed, and a rough-surfaced polysilicon film is formed on the surface of the polysilicon film 12 (STEP 404). An amorphous silicon film is formed on the surface of the inner wall of the trench T1, for example. By subjecting the surface of the amorphous silicon film to HSG processing, a rough-surfaced polysilicon film made of HSG is formed.

Next, through LP-CVD, a silicon nitride film (SiN) is formed on the surface of the rough-surfaced polysilicon film (STEP 405). As a result, the capacitor insulating film 13 is formed.

Figure 12A:
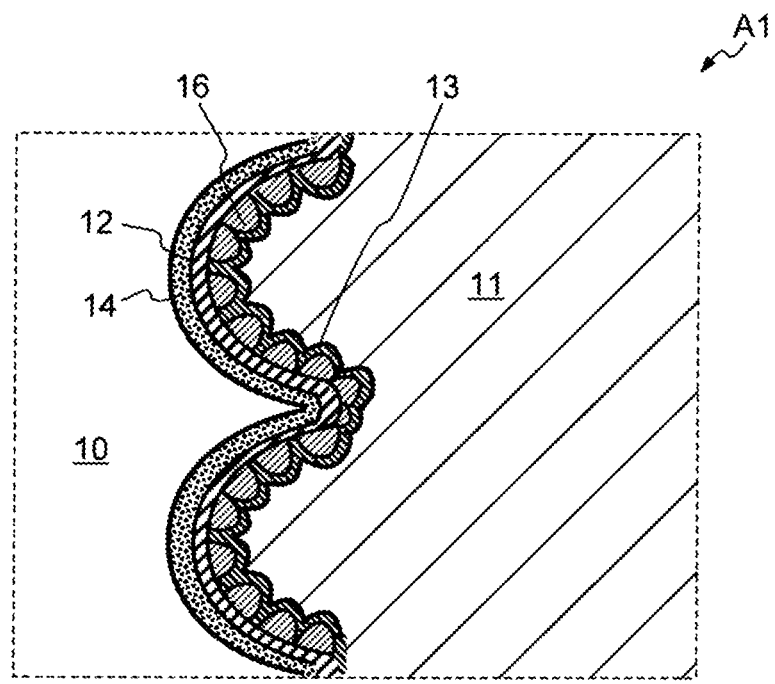
FIG. 12A is a cross-sectional view showing a section of a surface during the formation step for a capacitor insulating film of a trench capacitor according to Embodiment 4 of the present invention.

FIG. 12A is an enlarged cross-sectional view of a portion of the trench at the stage when the capacitor insulating film 13 has been formed in STEP 405.

The polysilicon film 14 doped with impurities is formed on the surface of the semiconductor substrate 10 in the interior of the trench, and the non-doped polysilicon film 12 is formed on the surface of the polysilicon film 14. The rough-surfaced polysilicon film 16 is formed on the surface of the polysilicon film 12.

The rough-surfaced polysilicon film 16 has recesses and protrusions that are 500-1000 Å in length, for example. That is, the recesses/protrusions of the rough-surfaced polysilicon film 16 are much smaller than the recess/protrusion structure (1-2 μm, for example) of the inner wall surface of the trench T1 formed through Bosch etching.

With reference to FIG. 11, heat annealing is performed on the semiconductor substrate 10, the surface of which has formed sequentially thereon the polysilicon film 14 doped with impurities, the non-doped polysilicon film 12, the rough-surfaced polysilicon film 16, and the capacitor insulating film 13 (STEP 406). As a result, the impurities in the polysilicon film 14 undergo solid-phase diffusion to the polysilicon film 12 and the rough-surfaced polysilicon film 16, resulting in the polysilicon film 14, the polysilicon film 12, and the rough-surfaced polysilicon film 16 being doped with the impurities.

Thereafter, similar to Embodiment 3, the formation of the opposite electrode 11 (STEP 407) and the formation of the contacts CT1 and CT2 (STEP 408) are performed.

Figure 12B:
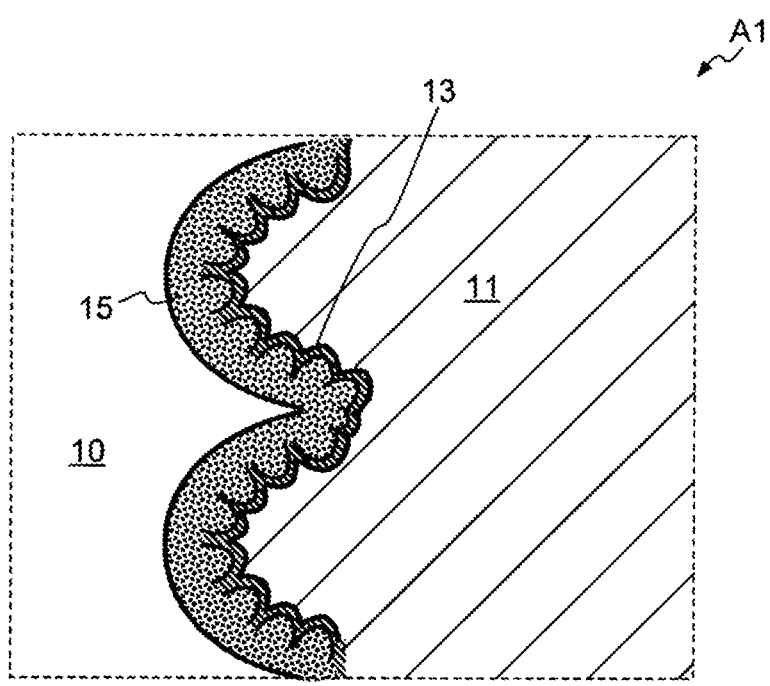
FIG. 12B is a cross-sectional view showing a section of a surface of the trench capacitor that has been annealed according to Embodiment 4 of the present invention.

FIG. 12B is an enlarged cross-sectional view of a portion of the trench of the semiconductor substrate 10 manufactured through these manufacturing steps. As a result of the heat annealing of STEP 406, the polysilicon film 14, the polysilicon film 12, and the rough-surfaced polysilicon film 16 are collectively doped to form the polysilicon film 15 including a rough-surfaced polysilicon on the surface.

In the semiconductor device 400 of the present embodiment, the polysilicon film 15 having the surface including this rough-surfaced polysilicon (hereinafter referred to as the rough surface) is formed, and the capacitor insulating film 13 is formed on the surface of the polysilicon film 15. Thus, the surface area of the trench is greater than a case in which the rough surface is not formed on the surface below the capacitor insulating film 13.

Also, the recesses/protrusions of the rough-surfaced polysilicon are, as described above, much smaller than the recess/protrusion structure of the side wall surface of the trench T1. Thus, the effect of increasing the surface area through the recess/protrusion structure ("scalloping") of the side wall surface of the trench T1 can be combined with the effect of increasing the surface area through the recesses/protrusions of the rough-surfaced polysilicon. If the recess/protrusion structure formed through Bosch etching had the effect of increasing the surface area by 1.5 times, and the rough-surfaced polysilicon had the effect of doubling the surface area, then these two measures combined would result in a tripling of the surface area, for example.

Also, the recesses and protrusions of the rough surface of the polysilicon film 15 do not have acute angled portions, unlike the micro-recesses/protrusions BU (that is, micro-recesses/protrusions on the surface below the polysilicon film 15) resulting from Bosch etching. Thus, there is no reduction in breakdown voltage of the capacitor insulating film 13 resulting from the recesses and protrusions of the rough surface of the polysilicon film 15.

Therefore, according to the semiconductor device 400 of the present embodiment, it is possible to further increase the capacitance per unit area of the trench capacitor TC while mitigating a reduction in breakdown voltage of the capacitor insulating film.

The present invention is not limited to the embodiments above. In the embodiments above, examples were described in which the opposite electrode 11 is formed using polysilicon. However, the present invention is not limited thereto, and the opposite electrode 11 may be made of a conductive layer constituted of another conductive material other than polysilicon.

In the embodiments above, examples were described in which polysilicon films (non-doped polysilicon film 12 or polysilicon films 14 and 15 that are doped with impurities) are used as semiconductor films that cover the acute angled portions of the recess/protrusion structure of the trench. However, the present invention is not limited thereto, and semiconductor films other than polysilicon films may be used.

In the embodiments above, examples were described in Embodiments 3 and 4 of performing heat annealing. However, heat annealing may be performed in Embodiments 1 and 2 as well after forming the capacitor insulating film 13.

In the embodiments above, an example was described in which the recess/protrusion structure formed on the side wall surface of the trench by Bosch etching has recesses of approximately 1-2 μm in size. However, the size of the recesses is not limited thereto.

In Embodiment 4, an example was described in which the polysilicon film 12 is formed by similar manufacturing steps to Embodiment 3, after which the rough-surfaced polysilicon film 16 is formed on the surface thereof. However, the present invention is not limited thereto, and the rough-surfaced polysilicon film may be combined with Embodiment 1 or 2. For example, a polysilicon film having a rough surface over the entirety thereof may be formed by forming the rough-surfaced polysilicon film 16 on the surface of the polysilicon film 14 of Embodiment 2 and performing heat annealing thereon.

What is claimed is:

1. A semiconductor device, comprising:
a semiconductor substrate;
a trench that extends from a first surface of the semiconductor substrate towards an interior of the semiconductor substrate, and that has a recess/protrusion structure on a side wall surface thereof;
a semiconductor film that is formed so as to cover the side wall surface of the trench, be continuous with the side wall surface, and extend onto the first surface of the semiconductor substrate;
an opposite electrode having a first portion that is provided at a position opposing the semiconductor substrate while sandwiching the semiconductor film between the opposite electrode and the semiconductor substrate, and that extends on the first surface of the semiconductor substrate, and a second portion that is continuous with the first portion and extends so as to fill the trench; and
an insulating film that insulates the semiconductor film from the opposite electrode;
wherein
the semiconductor film includes a rough-surfaced polysilicon having on a surface thereof a hemispherical grain structure, and
recesses and protrusions of the rough-surfaced polysilicon are smaller than recesses and protrusions of the recess/protrusion structure on the side wall surface.

2. The semiconductor device according to claim 1, wherein the semiconductor film is doped with impurities.

3. The semiconductor device according to claim 1, wherein the recess/protrusion structure includes a pointed protrusion.

4. The semiconductor device according to claim 1, wherein the trench is formed by Bosch etching, and wherein the recess/protrusion structure is a scale-like recess/protrusion structure formed during a process of performing the Bosch etching.

5. The semiconductor device according to claim 1, wherein the semiconductor film comprises a collectively-doped annealed combination of a non-doped polysilicon film, a doped polysilicon film and a rough-surfaced polysilicon film.

6. The semiconductor device according to claim 1, wherein the recesses and protrusions of the rough-surfaced polysilicon are 500-1000 Å in length, and the recesses and protrusions of the recess/protrusion structure on the side wall surface are 1-2 µm in length.

* * * * *